METAL TO PLASTIC LAMINATED ARTICLE AND THE METHOD OF MAKING THE SAME
Filed June 10, 1957

INVENTORS
LOUIS B. ALLEN
DAVID E. McELROY
SIDNEY J. STEIN
BY Donald S. Cohen
ATTORNEY United States Patent Office 2,955,974

Patented Oct. 11, 1960

2,955,974

METAL TO PLASTIC LAMINATED ARTICLE AND THE METHOD OF MAKING THE SAME

Louis B. Allen, Haddonfield, N.J., and David E. McElroy, Cheltenham Township, and Sidney J. Stein, Philadelphia, Pa., assignors to International Resistance Company, Philadelphia, Pa.

Filed June 10, 1957, Ser. No. 664,688

5 Claims. (Cl. 154—128)

This invention relates to a metal to plastic laminated article, particularly for use in the electrical field as printed wiring circuit panels, and the method of making the same. This application is a continuation-in-part of the co-pending applications of Sidney J. Stein and Louis B. Allen, Serial No. 421,339, filed April 6, 1954, and Serial No. 579,079, filed April 18, 1956, both now abandoned.

Heretofore, printed wiring circuit panels were composed of a sheet of an electrically conductive metal, such as copper, bonded to a sheet of an insulating plastic, such as a phenolic or epoxy resin. The metal was bonded to the plastic either by merely applying heat and pressure to the laminate or by using an adhesive. Portions of the metal were then removed, such as by chemical etching, to form the desired wiring circuit arrangement. These panels have many disadvantages caused particularly by the poor electrical properties of the plastics which were available for use in making the panels. These plastics have relatively low arc resistance so that relatively small differences in voltage between various portions of the wiring circuit will cause arcing therebetween. Furthermore, such an arc will form a carbonized path in the plastic which shorts out the wiring circuit. Also, these plastics have relatively low surface resistance and relatively high moisture absorption which adversely affect the wiring circuit. Another problem with these panels arises during the attachment of the various electrical components to the wiring circuit. This is normally done by inserting the terminals of the components through holes in the panel and then dipping the terminals and the surface of the panel having the wiring circuit thereon in a bath of molten solder. This provides a solder joint between the component terminals and the wiring circuit to mechanically and electrically connect the components to the wiring circuit. However, these panels are easily adversely affected by the heat of the molten solder so that great care must be taken when carrying out the dip soldering operation in order not to damage the panel.

It is well known that the fluorocarbon plastics, such as polytetrafluoroethylene and polytrifluorochloroethylene, have improved electrical properties which make them excellent materials for use in making printed circuit wiring panels. However, the use of these materials has been limited because of their inherent characteristic that they do not readily adhere to other materials. Therefore, it has been very difficult to bond a metal layer to a supporting sheet of the fluorocarbon resins to make printed circuit panels. Co-pending patent applications, Serial No. 421,339 and Serial No. 579,079 disclose a method of readily and strongly bonding copper to the fluorocarbon resins so that these resins can be used for printed circuit panels. The panels made with the fluorocarbon plastics have many improved properties over the panels made with other resins. The arc resistance is higher and even if the voltage gets high enough to cause arcing the arc does not form a carbonized path which shorts the circuit. Also, the surface resistivity is higher and the moisture absorption is practically nil. However, the panels made with a supporting layer of the fluorocarbon resins do have some disadvantages. A big disadvantage of the fluorocarbon resins is that they are expensive, particularly when compared in price to the resins previously used. Also, they are not as rigid as the resins previously used so that a thicker sheet is required which increases the cost of the panel to a greater degree. Furthermore, the fluorocarbon resin panels do not withstand the heat of the dip soldering step any better than do most other resins.

Therefore, it is an object of this invention to provide a metal to plastic laminated article and the method of making the same which has improved electrical properties and which is relatively inexpensive to manufacture. It is another object of this invention to provide a metal to plastic laminated article for use as a printed wiring circuit panel which has the improved electrical properties of the fluorocarbon resins but which is rigid and relatively inexpensive to manufacture. It is a further object of this invention to provide a metal to plastic laminate for printed wiring circuit panels which has improved properties for withstanding the dip soldering process. Other objects of the invention will in part be obvious and will in part appear hereinafter.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

For a fuller understanding of the nature and objects of the invention, reference should be had to the following detailed description taken in connection with the accompanying drawing in which.

Figure 1:
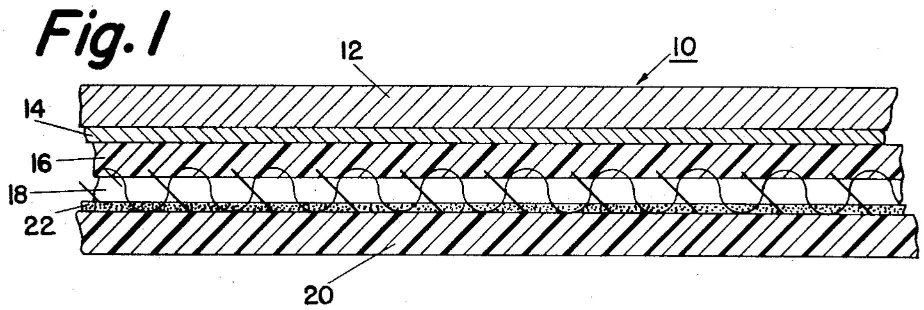
Figure 1 is a sectional view of the laminated article of this invention.

Referring to Figure 1 of the drawing, the laminated article 10 comprises a layer of copper 12 having an oxide bonding layer 14 on one surface thereof. As described in detail in co-pending application Serial No. 579,079, the oxide bonding layer comprises a coating of a mixture of cupric oxide and cuprous oxide with the exposed surface of the layer being mainly cupric oxide. Adhered to the cupric oxide surface of the oxide layer 14 is a thin solid layer of a fluorocarbon resin 16, such as a polymer or a co-polymer containing a substantial amount of trifluorochloroethylene or a co-polymer of tetrafluoroethylene and hexafluoropropylene, known by the Du Pont Company's trade name "Teflon 100–X". A sheet 18 of a porous material which will withstand high temperatures, such as a glass cloth, is partially embedded in the surface of the fluorocarbon resin layer 16. The sheet 18 is not completely embedded in the fluorocarbon resin layer 16 but only enough so that the resin fills enough of the pores of the sheet to provide a good mechanical bond between the resin layer and the sheet. A heavier plastic backing or supporting layer 20 is bonded to the porous sheet 18 by means of an adhesive 22 which adheres to the backing layer 20 and which penetrates the unfilled portion of the porous sheet 18. The backing layer 20 may be of any of the well known, relatively inexpensive plastics which will provide the desired physical properties, such as a phenolic, epoxy or silicone resin, preferably containing any well known filler, such as a fiber, fabric or paper, for strength. The adhesive 22 must be of a type which not only will bond strongly to the backing layer 20 but which will not be attacked by the chemicals used in etching the copper layer 12 when making printed circuit wiring. It has been found that an epoxy resin adhesive will adhere well to the various materials used for the backing layer 20 and will also withstand attack by solutions of ferric chloride which is the chemical usually used for etching the copper. Although the laminated article 10 is shown having a metal layer 12 bonded to only one surface of the backing layer 20, a second metal layer can be similarly bonded to the other surface of the backing layer.

Figure 2:
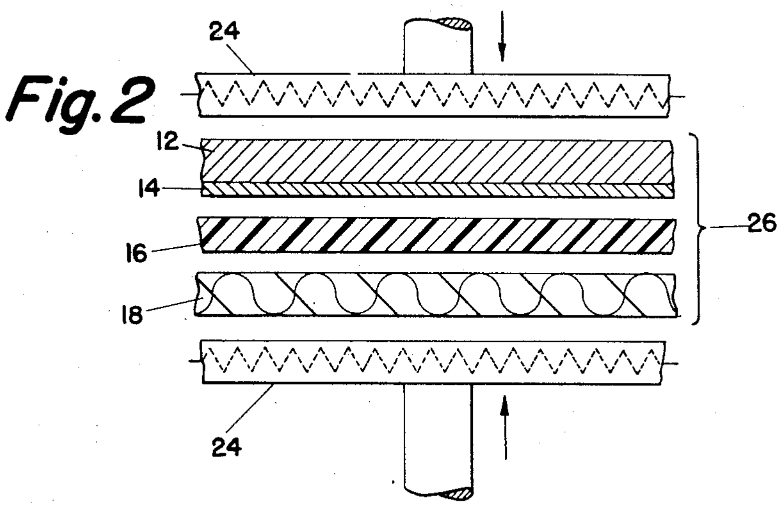
Figure 2 is a diagrammatic view of one step in the manufacturing of the laminated article.

To manufacture the laminated article 10 the copper layer 12 is first provided with the oxide bonding layer. As described in detail in co-pending application Serial No. 579,079, this is accomplished by immersing a sheet of copper in a chemical oxidizing agent, preferably a hot alkaline chlorite solution sold by the Enthone Corporation under the trademark "Ebonol-G." The copper is held in the solution until the surface of the copper turns jet black, which takes from 3 to 10 minutes when using a solution at a temperature of about 95° C. As shown in Figure 2, the copper layer 12 having the oxide layer 14 thereon is stacked with a pre-formed thin solid sheet of the fluorocarbon resin 16 and a sheet of the glass cloth 18 or other porous material with the resin being sandwiched between the glass fabric and the oxide layer. The stack is placed between the heated platens 24—24 of a press and the platens are closed on the stack to apply heat and pressure thereto. The platens are at a temperature high enough to soften the fluorocarbon resin and cause it to flow but not high enough to cause decomposition of the resin which is preferably at a temperature of 475° F. to 485° F. for a thin film of the resin. The heated platens are first brought together against the stack without applying any pressure for a period long enough to heat up the fluorocarbon which takes approximately 2 minutes. A pressure of from 250 to 1000 pounds per square inch is then applied for a period long enough to cause the fluorocarbon resin to flow into the glass cloth 18 and to bond to the oxide layer 14 which, for a pressure of approximately 800 pounds per square inch, takes approximately 2 minutes. The stack is then placed between the platens of a cold press and a pressure of 100–400 pounds per square inch is applied until the stack cools. The cooling under pressure prevents wrinkling, caused by difference in shrinkage of the various layers, and possible ruptures in the bonding layer.

Figure 3:
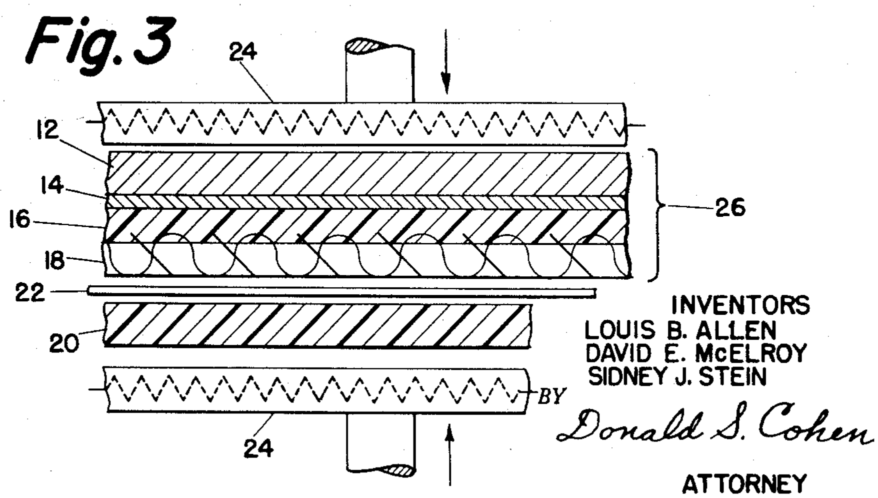
Figure 3 is a diagrammatic view of another step in the manufacturing of the laminated article.

The copper to fluorocarbon resin to glass cloth laminate 26 is then stacked with a backing layer 20 with an adhesive layer 22 therebetween and the stack is placed between the heated platens 24—24 as seen in Figure 3. For ease and quickness of handling the adhesive layer 22 is preferably in the form of a pre-formed dry sheet, but it can also be a liquid coating applied to the exposed surface of the glass cloth and air dried. A dry adhesive layer is preferred for ease of handling and to permit the alignment of the layers without concern over whether the adhesive will set too soon. The platens 24—24 are then brought together to apply heat and a light pressure to the stack. The platens are at a temperature sufficient to heat the adhesive to the recommended curing temperature for the particular adhesive used and is maintained long enough to cure the adhesive. For the epoxy adhesive a temperature of approximately 360° F. is recommended, to be maintained for about 10 minutes. The pressure applied is sufficient to cause the adhesive to flow into the glass cloth and bond to the backing layer 20 but not so high that the adhesive will squirt out from between the layers. This pressure depends upon the particular adhesive and backing layer material being used and can be easily determined experimentally for each combination of materials. After the adhesive layer 22 has cured, the laminated article 10 is removed from the press and allowed to cool.

Thus there is provided a laminated article for use in making printed wiring circuit panels which has excellent electrical properties and which is relatively inexpensive to manufacture. Since the surface directly beneath the copper is a fluorocarbon resin, the printed wiring circuit panel will have all of the excellent electrical properties of the fluorocarbon resin previously described. Furthermore the oxide bonding layer will not detract from these properties since the same chemicals used in removing the copper during the operation of forming the wiring pattern will also remove the oxide under the copper so that the area between the various portions of the wiring pattern will be the surface of the fluorocarbon resin. Furthermore, since the fluorocarbon layer is very thin, the laminated article of this invention is much less expensive than using a backing layer entirely of the fluorocarbon resin and, even if the laminated article is slightly more expensive than if no fluorocarbon resin was used at all, this difference is more than compensated for by the improvement in the electrical properties.

In addition, it has been found that the laminated article of this invention can withstand the heat of the molten solder bath when attaching the components to the printed wiring circuit much better than practically any of the previously known type laminates. The standard test for this property of a laminated article is known as the "solder pot" test and comprises floating a one inch square of the laminate, with the metal side down, on the surface of a molten solder bath which is at a known temperature measured one inch below the surface of the bath. The maximum time which the laminate can be floated on the solder without damage to the bond between the metal and the plastic, by the metal either peeling off or becoming distorted, is the characteristic of this test by which the laminates are compared. Practically all of the previously known metal to plastic laminated articles used for printed wiring circuit panels, including the type having an all fluorocarbon resin backing, have a "solder pot" time in a solder bath at approximately 480° F. of 8 to 13 seconds while the composite laminate of this invention has been found to have a "solder pot" time of up to 30 seconds in a solder bath at approximately 500° F. Thus, a printed wiring circuit panel made from the laminated article of this invention requires much less care and can be handled more easily in the assembling of the electrical components to the circuit pattern.

It will thus be seen that the objects set forth above, among those made apparent from the preceding description, are efficiently attained and, since certain changes may be made in carrying out the above method and in the article set forth without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described and all the statements of the cope of the invention which, as a matter of language, might be said to fall therebetween.

Having described our invention, what we claim as new and desire to secure by Letters Patent is:

1. The method of making a composite laminated article comprising the steps of forming a layer of cupric oxide on the surface of a copper sheet, stacking said copper sheet with a thin layer of a fluorocarbon resin selected from the group consisting of trifluorochloroethylene and a copolymer of tetrafluoroethylene and hexafluoropropylene and a sheet of glass cloth with the resin layer being between the oxide layer and said sheet of glass cloth, applying heat and pressure to said stack to cause said fluorocarbon resin to bond to said oxide layer and to penetrate into the pores of said sheet of glass cloth and then bonding a backing layer of a solid plastic selected from the group consisting of phenolic, epoxy and silicone resins to said sheet of glass cloth.

2. The method, as set forth in claim 1, in which the backing layer is bonded to the sheet of glass cloth by placing a solid layer of an epoxy resin adhesive therebetween and then applying heat and pressure to the laminate to cause the adhesive to flow against said backing layer and into the pores of said sheet of glass cloth and cure said adhesive.

3. A laminated article comprising the combination of a layer of copper, a layer of copper oxide adhered to a surface of said copper, the surface of said copper oxide layer away from said copper layer being mainly cupric oxide, a thin layer of a solid thermoplastic fluorocarbon resin selected from the group consisting of trifluorochloroethylene and a copolymer of tetrafluoroethylene and hexafluoropropylene bonded to said copper oxide layer, and a heavier substantially rigid backing layer of a solid plastic selected from the group consisting of phenolic, epoxy and silicone resins bonded to said fluorocarbon resin layer.

4. A laminated article comprising the combination of a layer of copper, a layer of copper oxide adhered to a surface of said copper, the surface of said copper oxide layer away from said copper layer being mainly cupric oxide, a thin layer of a solid thermoplastic fluorocarbon resin selected from the group consisting of trifluorochloroethylene and a copolymer of tetrafluoroethylene and hexafluoropropylene bonded to said copper oxide layer, a sheet of glass cloth partially embedded in the surface of said fluorocarbon resin layer away from the copper oxide layer, and a heavier substantially rigid backing layer of a solid plastic selected from the group consisting of phenolic, epoxy and silicone resins bonded to said sheet of glass cloth.

5. The combination as set forth in claim 4 including an epoxy resin adhesion between and bonding said backing layer to said glass cloth.

References Cited in the file of this patent

UNITED STATES PATENTS

| | | |
|---|---|---|
| 2,528,932 | Wiles | Nov. 7, 1950 |
| 2,551,591 | Foord | May 8, 1951 |
| 2,686,738 | Teeters | Aug. 17, 1954 |
| 2,686,767 | Green | Aug. 17, 1954 |
| 2,699,402 | Meyer | Jan. 11, 1955 |
| 2,745,898 | Hurd | May 15, 1956 |
| 2,754,353 | Gilliam | July 10, 1956 |
| 2,768,925 | Fay | Oct. 30, 1956 |
| 2,774,705 | Smith | Dec. 18, 1956 |
| 2,809,130 | Rappaport | Oct. 8, 1957 |